(12) United States Patent
Beyer et al.

(10) Patent No.: US 6,825,097 B2
(45) Date of Patent: Nov. 30, 2004

(54) TRIPLE OXIDE FILL FOR TRENCH ISOLATION

(75) Inventors: Klaus D. Beyer, Poughkeepsie, NY (US); Patricia A. O'Neil, Fishkill, NY (US); Deborah A. Ryan, Lagrangeville, NY (US); Peter Smeys, Palo Alto, CA (US); Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 10/214,510

(22) Filed: Aug. 7, 2002

(65) Prior Publication Data

US 2004/0029352 A1 Feb. 12, 2004

(51) Int. Cl.[7] .................................................. H01L 21/76
(52) U.S. Cl. ........................ 438/424; 438/524; 438/404
(58) Field of Search .................................. 438/424, 524, 438/404, 437, 427, 435, 444, 445

(56) References Cited

U.S. PATENT DOCUMENTS

| 4,656,497 | A | 4/1987 | Rogers et al. |
|---|---|---|---|
| 5,099,304 | A | 3/1992 | Takemura et al. |
| 5,719,085 | A | 2/1998 | Moon et al. |
| 6,033,970 | A | 3/2000 | Park |
| 6,037,018 | A | 3/2000 | Jang et al. |
| 6,118,168 | A | 9/2000 | Moon et al. |
| 6,140,208 | A | 10/2000 | Agahi et al. |
| 6,180,467 | B1 | 1/2001 | Wu et al. |
| 6,194,283 | B1 | 2/2001 | Gardner et al. |
| 6,214,698 | B1 | 4/2001 | Liaw et al. |
| 6,255,194 | B1 | 7/2001 | Hong |
| 6,258,676 | B1 | 7/2001 | Lee et al. |
| 6,261,908 | B1 | 7/2001 | Hause et al. |
| 6,271,143 | B1 | 8/2001 | Mendicino |
| 6,271,153 | B1 | 8/2001 | Moore |
| 6,472,301 | B1 * | 10/2002 | Lin et al. ............... 438/524 |
| 6,521,510 | B1 * | 2/2003 | Fisher et al. ............ 438/424 |

FOREIGN PATENT DOCUMENTS

WO     WO 00/60659     10/2000

* cited by examiner

*Primary Examiner*—Caridad Everhart
(74) *Attorney, Agent, or Firm*—Eric Petraske; Margaret A. Pepper

(57) ABSTRACT

In an integrated circuit process for SOI including trench device isolation, the problem of voids in the trench fill is addressed by a triple fill process, in which a thermal oxide sidewall having recesses at the bottom corners is covered with a LPCVD deposition that fills in the recesses, followed by a void-free HDP deposition. Densification results in substantially the same etch rate for the three types of oxide.

16 Claims, 3 Drawing Sheets

TRIPLE OXIDE FILL FOR TRENCH ISOLATION

TECHNICAL FIELD

The field of the invention is that of integrated circuit processing with a process that includes a trench device isolation.

BACKGROUND OF THE INVENTION

In modern silicon integrated circuit processing, space requirements have resulted in great popularity for device isolation by etching trenches and filling them with oxide, rather than the LOCOS isolation popular in the past.

The technology for etching and filling such isolation trenches is well advanced, though improvements are continuously being developed.

A popular method of trench fill includes a step of growing a thin layer of thermal oxide to passivate the trench sidewalls, before the main filling step. A drawback of such an approach on SOI (Silicon On Insulator) wafers is that the thermal oxide does not grow on the trench bottom and also grows nonuniformily along the trench sidewalls. The thermal oxide liner is thicker toward the center and top, leaving a negative angle or recess near the bottom corner of the trench, denoted by numeral 114 in FIG. 2. Such a recess leaves a void in the bottom corners when the main fill is done with HDP (high density plasma) oxide deposition.

Filling the entire trench with LPCVD oxide fills the negative angle at the bottom corners preventing corner void formation. However, the drawback of this approach is the formation of a seam or center void. Thus, voids remain a problem that is present in contemporary approaches to trench isolation. Any void present in the trench fill can become a receptacle during subsequent processing for conductive material such as polysilicon and may degrade product yield.

SUMMARY OF THE INVENTION

The invention relates to a trench fill process for trench isolation that produces void-free trench filling.

A feature of the invention is the filling of sidewall recesses left by the initial thermal oxide step.

Another feature of the invention is a thin filling layer of low density oxide fill having intermediate conformality: i.e. is thicker where it fills the bottom corners.

Another feature of the invention is filling the remaining aperture with HDP oxide.

Yet another feature of the invention is densifying the filling layer so that the final composite oxide fill has substantially the same etch rate for all three components.

DETAILED DESCRIPTION

Figure 1:
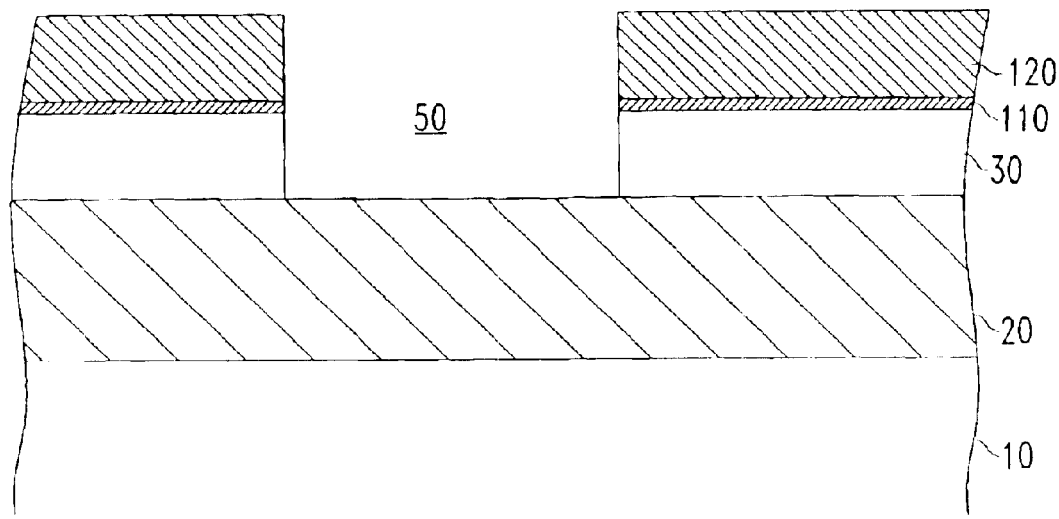
FIGS. 1 and 2 show, in cross section, preliminary steps in the formation of trench isolation.

A section of an SOI (silicon on insulator) wafer 10 is shown in FIG. 1 and following figures. This example is that of a silicon substrate 10 with a silicon device layer 30, separated by an implanted SIMOX (Separation by IMplantation of OXygen) layer 20, but bonded oxide insulating layers and Silicon-germanium device layers may also benefit from the invention.

An aperture 50 has been etched through pad oxide 110 (illustratively 8 nm of thermal oxide) and pad nitride 120 (illustratively 120 nm of LPCVD $Si_3N_4$) and silicon device layer 30 (illustratively 120 nm). Illustratively, the etch for the pad oxide and nitride is an $NF_3$/Ar RIE (reactive ion etch) and the etch for device layer 30 is HBr and $Cl_2$. This latter etch is very selective to oxide, so that, for the parameters specified, only about 10 nm of insulating layer (buried oxide, BOX) 20 is removed.

Figure 2:
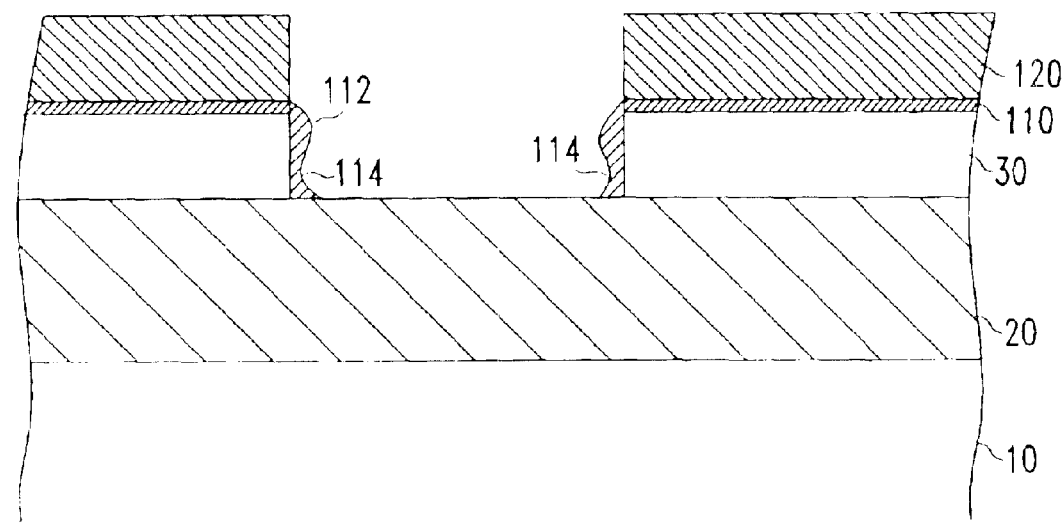

FIG. 2 shows the result of a rapid thermal oxidation of the vertical walls of device layer 30, producing 10–30 nm of oxide 112 at the thickest point. This provides sufficient corner rounding to prevent the occurrence of corner leakage during device operation.

A problem with this technique is that the thickest portion of the oxide 112 is toward the center and top of the trench, leaving a recessed portion or negative trench angle 114 at the bottom near the corners.

Figure 3A:
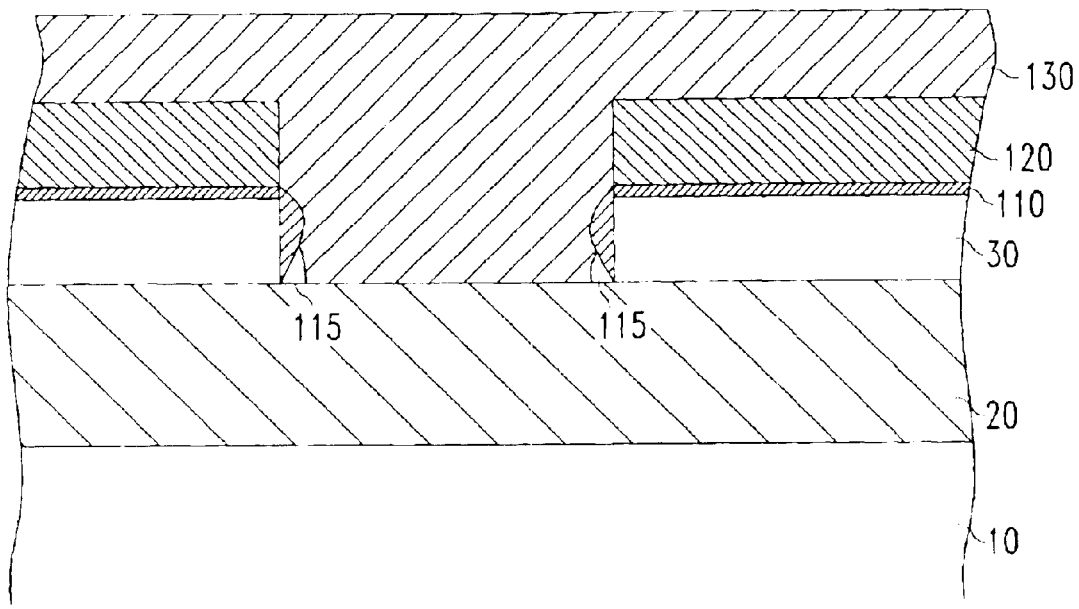
FIGS. 3A and 3B show problems with prior art approaches.

As can be seen in FIG. 3A, a fill with HDP oxide 130 leaves voids 115 at the bottom corners, since the fill tends to deposit directionally. In operation, these voids present the problem. During subsequent processing, planarization and wet chemical etching will recess the HDP oxide height or thickness. Eventual exposure of the void and expansion due to wet etching leaves a receptacle for polysilicon conductor material to deposit. Such an occurrence will electrically short neighboring devices, leading to product failure.

Figure 3B:
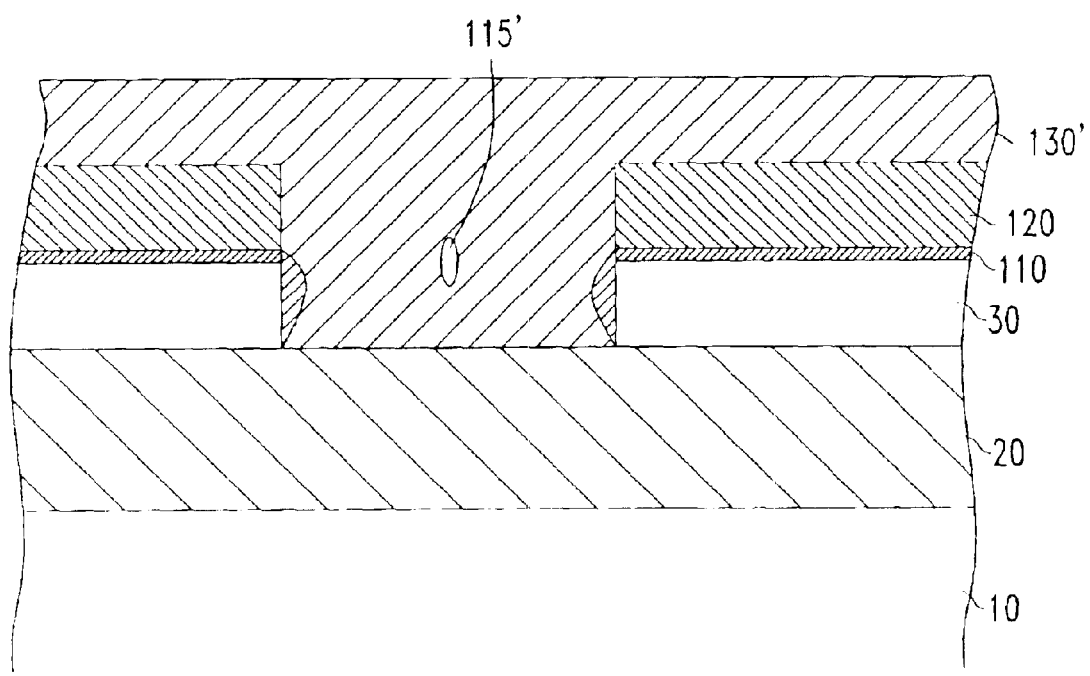
Figure 4:
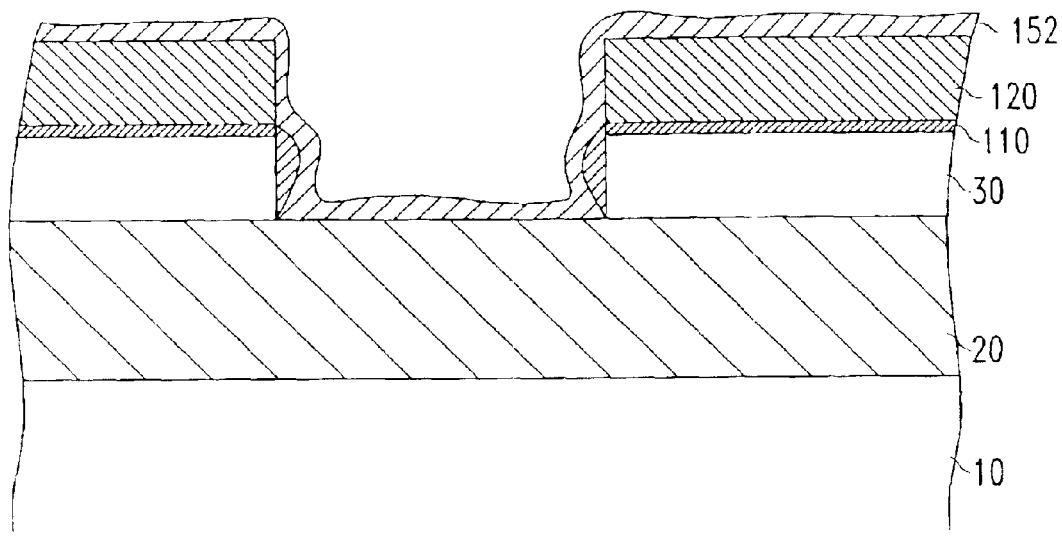
FIGS. 4 and 5 show steps in the inventive process.
Figure 5:
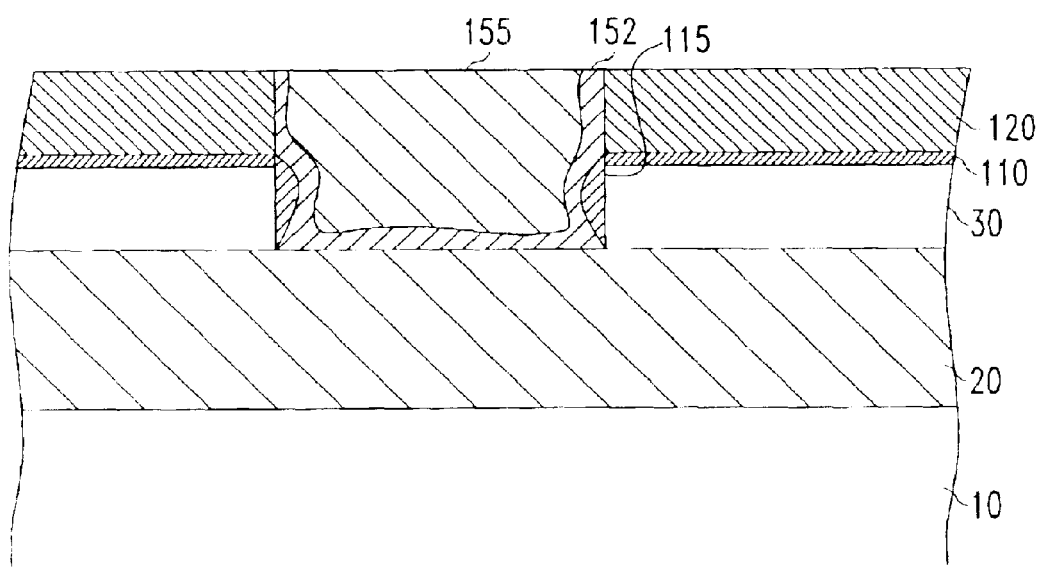

A fill with LPCVD oxide 130' (in FIG. 3B) fills in the bottom corners, but leaves a void or seam 115' at the center. This center void has the same drawback previously discussed. It, too, can fill with polysilicon conductive material and cause failure due to device shorting. Failure due to a center void is likely to occur more readily than failure due to a bottom corner since the center void is in closer proximity to the device surface and therefore more easily exposed during processing.

The inventors have found that both types of voids can be avoided if a preliminary low density oxide liner 152 is deposited, having a thickness in this example of between 25 nm to 45 nm. The actual thickness required is dependent upon the deposition technique used, the resulting liner density, and the degree of recess at the bottom corner of the starting trench. A thickness of about 15 nm greater than the thickness of liner 112 gives sufficient filling margin in the case of LPCVD. When the second liner is deposited by RTCVD, a thickness of about 30 nm greater than the thickness of liner 112 is preferred. Those skilled in the art will readily be able to determine a suitable thickness to fill in their non-planarity. Examples of preliminary liner deposition techniques include LPCVD TEOS (TetraEthyl OrthoSilicate) and RTCVD oxide. Unexpectedly, for these techniques the thin preliminary liner is only moderately conformal and fills in the recesses or negative trench angles 114, leaving a face that is substantially planar compared with the face left by liner 112 of FIG. 2. In the case of LPCVD TEOS, liner 152 is deposited at a temperature in the range of 620–700 degrees C., with 620 degrees preferred, a chemistry of tetraethyl orthosilicate and pressure range of 200 to 1000 mTorr, with 1000 mTorr preferred. In the case of RTCVD, the deposition is preferably done at a temperature in the range of 700 to 775 degrees C., with 775 degrees C. preferred, a chemistry of $N_2O$ and $SiH_4$ and pressure range of 15 to 75 Torr, with 15 Torr preferred.

As was described above, the desired result is to apply an intermediate layer of only moderate conformality in a manner to reduce the thickness difference of the thermal oxide passivation layer: i.e. thicker where the passivation layer is thin and vice versa. The examples have been given as an illustration of possible approaches. Those skilled in the art will readily be able, in the light of this disclosure, to modify the processes illustrated to suit their conditions and to apply the teachings to other processes: e.g. PECVD.

A HDP oxide layer 155 is deposited to a nominal thickness which is dependent upon on the technology node and the corresponding trench depth for that node.

A densification step, illustratively comprising a rapid thermal anneal at 1100 degrees C. in Argon/$O_2$ densifies preliminary liner 112, so that the wet etching rate (in a conventional BHF or DHF mixture) is similar for HDP oxide 155 and the low density preliminary liner oxide (such as TEOS) 112. The densification can be done at any convenient time.

The trench fill (HDP and liner) is then planarized, using nitride 120 as a polish stop.

While the invention has been described in terms of a single preferred embodiment, those skilled in the art will recognize that the invention can be practiced in various versions within the spirit and scope of the following claims.

What is claimed is:

1. A method of forming an isolation trench in a silicon substrate having a device layer above an insulating layer (SOI), comprising the steps of:
   etching a trench with substantially vertical sides and bottom corners in said SOI substrate;
   growing a first liner of thermal oxide having a first liner thickness on said vertical sides and a second thickness, smaller than said first thickness, in said bottom corners, whereby said aperture has a greater width at the bottom;
   depositing a preliminary liner of oxide of moderate conformality on said first liner on said sides and in said bottom corners, said preliminary liner being thicker in said bottom corners and, together with said first liner, leaving an aperture within said trench having substantially vertical sides; and
   depositing an oxide fill layer filling said aperture and extending outside said trench; whereby the material filling said isolation trench at an intermediate level comprises at least three types of oxide—said first liner of thermal oxide adjacent to said vertical sides, said preliminary liner abutting said first liner and said oxide fill layer abutting said preliminary liner.

2. A method of forming an isolation trench in a silicon substrate having a device layer above an insulating layer (SOI), comprising the steps of:
   etching a trench with substantially vertical sides and bottom corners in said SOI substrate;
   growing a first liner of thermal oxide having a first liner thickness on said vertical sides and a second thickness, smaller than said first thickness, in said bottom corners, whereby said aperture has a greater width at the bottom;
   depositing a preliminary liner of oxide of moderate conformality on said sides and in said bottom corners, said preliminary liner being thicker in said bottom corners and leaving an aperture within said trench having substantially vertical sides; and
   depositing an oxide fill layer filling said aperture and extending outside said trench; further comprising a step of densification of said preliminary liner by rapid thermal anneal oxidation, whereby said preliminary liner and said oxide fill layer have a comparable wet etch rate.

3. A method according to claim 2, in which said preliminary liner is deposited by LPCVD at a temperature below 700 degrees Centigrade.

4. A method according to claim 3, in which said step of growing said first liner is performed by rapid thermal oxidation and said first liner has a thickness in the range 10 nm–30 nm.

5. A method according to claim 4, in which said preliminary liner has a thickness about 15 nm greater than said first liner thickness.

6. A method according to claim 2, in which said preliminary liner is deposited by RTCVD at a temperature below 775 degrees Centigrade.

7. A method according to claim 6, in which said step of growing said first liner is performed by rapid thermal oxidation and said first liner has a thickness in the range 10 nm–30 nm.

8. A method according to claim 7, in which said preliminary liner has a thickness about 30 nm greater than said first liner thickness.

9. A method according to claim 2, further comprising a step of densification of said preliminary liner by rapid thermal oxidation after said step of depositing said oxide fill layer, whereby said preliminary liner and said oxide fill layer have a comparable wet etch rate.

10. A method according to claim 2, further comprising a step of densification of said preliminary liner by rapid thermal oxidation before said step of depositing said oxide fill layer, whereby said preliminary liner and said oxide fill layer have a comparable wet etch rate.

11. A method of forming an isolation trench in a silicon substrate having a device layer above an insulating layer (SOI), comprising the steps of:
    etching a trench with substantially vertical sides and bottom corners in said SOI substrate;
    growing a first liner of thermal oxide having a first liner thickness on said vertical sides and a second thickness, smaller than said first thickness, in said bottom corners, whereby said aperture has a greater width at the bottom;
    depositing a preliminary liner of oxide of moderate conformality on said sides and in said bottom corners, said preliminary liner being thicker in said bottom corners and leaving an aperture within said trench having substantially vertical sides; and
    depositing an oxide fill layer filling said aperture and extending outside said trench; in which said preliminary liner is deposited by LPCVD at a temperature below 700 degrees Centigrade.

12. A method according to claim 11, in which said step of growing said first liner is performed by rapid thermal oxidation and said first liner has a thickness in the range 10 nm–30nm.

13. A method according to claim 12, in which said preliminary liner has a thickness about 10 nm greater than said first liner thickness.

14. A method of forming an isolation trench in a silicon substrate having a device layer above an insulating layer (SOI), comprising the steps of:
    etching a trench with substantially vertical sides and bottom corners in said SOI substrate;

growing a first liner of thermal oxide having a first liner thickness on said vertical sides and a second thickness, smaller than said first thickness, in said bottom corners, whereby said aperture has a greater width at the bottom;

depositing a preliminary liner of oxide of moderate conformality on said sides and in said bottom corners, said preliminary liner being thicker in said bottom corners and leaving an aperture within said trench having substantially vertical sides; and depositing an oxide fill layer filling said aperture and extending outside said trench; in which said step of depositing said preliminary liner is performed deposited by RTCVD at a temperature below 775 degrees Centigrade.

15. A method according to claim 14, in which said step of growing said first liner is performed by rapid thermal oxidation and said first liner has a thickness in the range 10 nm–30 nm.

16. A method according to claim 15, in which said preliminary liner has a thickness about 30 nm greater than said first liner thickness.

* * * * *